(12) United States Patent
Zickar (10) Patent No.: US 11,215,296 B2
(45) Date of Patent: Jan. 4, 2022

(54) VALVE, IN PARTICULAR VACUUM VALVE

(71) Applicant: VAT Holding AG, Haag (CH)

(72) Inventor: Michael Zickar, Englburg (CH)

(73) Assignee: VAT Holding AG, Haag (CH)

( * ) Notice: Subject to any disclaimer, the term of this patent is extended or adjusted under 35 U.S.C. 154(b) by 0 days.

(21) Appl. No.: 16/495,551

(22) PCT Filed: Mar. 6, 2018

(86) PCT No.: PCT/EP2018/055435
§ 371 (c)(1),
(2) Date: Sep. 19, 2019

(87) PCT Pub. No.: WO2018/177695
PCT Pub. Date: Oct. 4, 2018

(65) Prior Publication Data
US 2020/0096133 A1 Mar. 26, 2020

(30) Foreign Application Priority Data
Mar. 31, 2017 (AT) .................................. A 135/2017

(51) Int. Cl.
*F16K 51/02* (2006.01)
*F16K 3/314* (2006.01)
(Continued)

(52) U.S. Cl.
CPC .............. *F16K 51/02* (2013.01); *F16K 3/314* (2013.01); *F16K 3/0254* (2013.01); *F16K 3/188* (2013.01);
(Continued)

(58) Field of Classification Search
CPC . F16K 3/314; F16K 3/18; F16K 51/02; Y10T 279/1216; Y10T 279/1029
(Continued)

(56) References Cited

U.S. PATENT DOCUMENTS 3,202,432 A  8/1965 Cameron
4,923,320 A  5/1990 Klischat
(Continued)

FOREIGN PATENT DOCUMENTS

CH  699258  2/2010
CN  101889162  11/2010
(Continued)

*Primary Examiner* — Kenneth Rinehart
*Assistant Examiner* — Nicole Gardner
(74) *Attorney, Agent, or Firm* — Volpe Koenig (57) ABSTRACT

A valve (1) having at least one closure member (2) for closing a valve opening (3) and at least one valve rod (4), at least one first connecting section (5) being provided in or on the valve rod (4), at least one second connecting section (6) being provided in or on the closure member (2), and the closure member being fastenable or fastened to the valve rod by the connection of the first connecting section to the second connecting section. The first connecting section (5) and/or the second connecting section (6) has/have at least one pressure chamber (8) for a fluid, this chamber being delimited by at least one elastically deformable boundary wall (7) and the boundary wall can be elastically deformed by the fluid provided in the pressure chamber (8) in order to form a clamped connection of the first connecting section (5) to the second connecting section (6).

10 Claims, 4 Drawing Sheets

(51) Int. Cl.
*F16K 3/02* (2006.01)
*F16K 3/18* (2006.01)
*F16K 31/122* (2006.01)
*H01L 21/67* (2006.01)

(52) U.S. Cl.
CPC ...... *F16K 31/122* (2013.01); *H01L 21/67126* (2013.01)

(58) Field of Classification Search
USPC .......................................................... 251/329
See application file for complete search history.

(56) References Cited

U.S. PATENT DOCUMENTS

| | | | |
|---|---|---|---|
| 4,964,432 A | 10/1990 | Chou | |
| 5,195,838 A | 3/1993 | Katz et al. | |
| 5,769,487 A | 6/1998 | Michler | |
| 7,134,642 B2 | 11/2006 | Seitz | |
| 7,959,130 B2 | 6/2011 | Duelli | |
| 8,348,234 B2 | 1/2013 | Duelli | |
| 8,657,257 B2 | 2/2014 | Shimoda et al. | |
| 2005/0191122 A1 | 9/2005 | Gethmann | |
| 2008/0179838 A1* | 7/2008 | Retzbach | B23B 31/305 279/2.08 |
| 2011/0140328 A1 | 6/2011 | Andre | |
| 2012/0061605 A1 | 3/2012 | White | |
| 2015/0014556 A1 | 1/2015 | Ishigaki et al. | |
| 2016/0363240 A1 | 12/2016 | Wagner et al. | |

FOREIGN PATENT DOCUMENTS

| | | |
|---|---|---|
| DE | 3720281 | 1/1989 |
| DE | 10112087 | 10/2002 |
| DE | 102006018587 | 10/2007 |
| DE | 102006018598 | 10/2007 |
| DE | 102010009172 | 8/2011 |
| DE | 102012007533 | 10/2012 |
| DE | 202013004696 | 10/2014 |
| EP | 0753368 | 1/1997 |
| EP | 2146122 | 1/2010 |
| EP | 2913573 | 9/2015 |
| WO | 2017050805 | 3/2017 |

* cited by examiner

VALVE, IN PARTICULAR VACUUM VALVE

BACKGROUND

The present invention relates to a valve in particular a vacuum valve, having at least one closure member for closing a valve opening, and with at least one valve rod, at least one first connecting section being arranged in or on the valve rod, and at least one second connecting section being arranged in or on the closure member, and the closure member being capable of being fastened or being fastened to the valve rod by way of connection of the first connecting section to the second connecting section.

Various possibilities as to how the closure member can be fastened to the valve rod by way of connection of the two connecting sections are known in the prior art. For example, DE 10 2012 007 533 A1 shows one variant, in the case of which the closure member is fastened to the valve rod or to its connecting section via the interaction of a clamping screw and an oblique face. EP 2 146 122 A1 discloses one variant, in the case of which separate clamping pieces are used to fasten the closure member to the valve rod. U.S. Pat. No. 7,134,642 B2 shows a solution in the case of which the closure member is fastened to the valve rod by a screw.

It is an important aspect in the case of valves, in particular if they are used in vacuum technology, that as few particles as possible are produced by way of abrasion in the valve itself, since said particles can disrupt the processes which are carried out in process chambers which open and close the valves. It is to be noted, moreover, that the closure members of valves occasionally have to be subjected to a service or have to be replaced. To this end, the closure member usually has to be released from the valve rod. The use of screw connections to this end has the problem that particles can be produced and/or released, in particular, by way of rubbing of heads of the screws on the bearing faces, against which they bear. Oblique faces, as shown in DE 10 2012 007 533 A1, on which oblique faces the components rub against one another during opening and closing of the connection, are also problematic. Particles can also be produced here by way of abrasion.

SUMMARY

It is an object of the invention to provide an alternative possibility for a valve of the above-mentioned type, as to how the two connecting sections can be connected to one another and therefore the closure member can be fastened to the valve rod.

In order to achieve this object, in the case of a valve of the above-mentioned type, the invention proposes that the first connecting section and/or the second connecting section have/has at least one pressure chamber for a fluid, which pressure chamber is delimited by at least one elastically deformable boundary wall, and it is possible for the boundary wall to be deformed elastically by the fluid which is arranged in the pressure chamber to form a clamping connection of the first connecting section to the second connecting section.

One core concept of the invention therefore provides that there is a pressure chamber with at least one elastically deformable boundary wall in at least one of the two connecting sections, it being possible for the boundary wall to be deformed elastically by way of a corresponding pressure build-up by a fluid in the pressure chamber, and therefore to be deflected in such a way that a clamping connection of the first connecting section to the second connecting section takes place as a result, whereby the closure member is then fastened to the valve rod. Here, the pressure chamber with its at least one elastically deformable boundary wall can be both part of the first connecting section and therefore arranged in or on the valve rod, or else can be part of the second connecting section and can therefore be arranged in or on the closure member. Variants are also conceivable, in the case of which both the first connecting section and the second connecting section in each case have at least one pressure chamber with at least one correspondingly deformable boundary wall. The elastically deformable boundary wall can therefore be part of the first connecting section or else part of the second connecting section. The boundary wall, wherever it is arranged, can in any case be deformed elastically by way of a corresponding pressure build-up in the fluid in the pressure chamber in such a way that a clamping connection of the first connecting section to the second connecting section occurs. This clamping connection is favorably a releasable connection. In a simplest form, the connection is released by the pressure in the fluid in the pressure chamber thus being decreased in such a way that the elastic restoring forces of the boundary wall move the latter into a position, in which the clamping connection is canceled, with the result that the second connecting section can be removed from the first connecting section, and therefore the closure member can be removed from the valve rod.

The invention has the advantage that, in a state, in which the pressure chamber is not under a correspondingly high pressure and the deformable boundary wall is in its starting position, the connecting sections of the valve rod and the closure member can be moved into a relative position with respect to one another by way of being pushed onto one another or in any way, such that the actual clamping connection is subsequently achieved merely by way of a corresponding elastic deformation of the boundary wall, which elastic deformation is produced by a fluid pressure increase in the pressure chamber. As a result, rubbing of two components against one another, in particular of the connecting sections against one another, can be avoided at least largely, with the result that no particles or only a very small amount of particles are also produced by way of abrasion.

Fundamentally, valves according to the invention can have only one closure member and also only one valve rod, and only one first connecting section and only one second connecting section. Other design variants of the invention are also possible, however, in the case of which there are two or more closure members and/or two or more valve rods. There can also be more than one first connecting section or more than one second connecting section, independently of the number of the closure members and the valve rods. The same applies to the pressure chamber and the boundary wall. The valve rod can also have, for example, a plurality of first connecting sections, just as there can be a plurality of second connecting sections in or on the closure member.

The term "valve rod" follows a generally customary terminology of said component of the valve which carries the closure member. The valve rod is often of rod-shaped configuration. In other words, the valve rod is preferably rod-shaped, that is to say, in yet other words, is preferably configured as a rod. The valve rod can fundamentally be of very different form, however. The term "valve rod" therefore sometimes makes no statement about its shape and/or outer contour. A closure member carrying element might therefore also be spoken of in general. The valve rod is at any rate a connection between the closure member and at least one valve drive of the valve. The valve rod and the closure member are often moved jointly by the valve drive, in order to move the closure member into its closed position or into its open position. It is to be noted here that, depending on how many movement directions the closure member is moved in between the closed position and the maximum open position, the valve can also have a different number of valve drives. The valve according to the invention can be configured, for example, as what is known as an L-port valve, in the case of which the closure member is moved along two movement paths which are angled away with respect to one another. In these cases, there can then be two valve drives. Solutions for L-port valves, in the case of which only one valve drive moves the closure member along the two movement paths in a manner which is coupled to a corresponding mechanism, are likewise well known in the prior art, however. The valve drives can be pneumatic, hydraulic, electric or other valve drives which are known in the prior art. The invention which is after all directed at the question of the connection of the closure member to the valve rod can be used in different valve types which are known per se in the prior art. It therefore does not necessarily have to be an L-port valve.

The closure member is at any rate that part of the valve which can close and open the at least one valve opening (there can also be a plurality of valve openings here). In the case of valve openings of correspondingly extensive configuration, the closure member can be what is known as a valve disk. The closure member can likewise also be configured as a valve needle or the like, however, or can have a valve needle of this type or the like, in order merely to mention further examples.

The valve favorably has a valve housing. The at least one valve opening which can be opened and also closed by the closure member is preferably situated in said valve housing. In this case, in particular, the valve opening is therefore part of the valve. This does not have to be the case, however. The valve opening can also be arranged on another component, such as for example directly on a process chamber. At least one valve seat, onto which the closure member is pressed in the closed position, as a rule runs around the valve opening. In the closed position, at least one seal is as a rule situated between the valve seat and the closure member. This seal can be arranged both on the closure member and on the valve seat. Variants are also conceivable, in the case of which there is at least one corresponding seal both on the closure member and on the valve seat.

The second connecting section can directly be a part of the closure member and therefore can be arranged in the closure member. Variants according to the invention are also conceivable, however, in the case of which the second connecting section is arranged on the closure member. This can be the case, for example, when the closure member is fixed on a closure member carrier, and the closure member carrier has the second connecting section, by way of which the closure member is fastened to the valve rod or to its first connecting section. The same also applies to the valve rod and the first connecting section. Here too, the first connecting section can be arranged directly in the connecting rod or else can also be arranged on an additional part which is fastened or fixed to the valve rod.

Valves according to the invention can be what are known as vacuum valves which are used in vacuum or negative pressure technology or are provided for said technology. In vacuum technology, valves of this type are frequently used to open and close process chambers. As is known per se, special gas compositions and pressure conditions which are required for the process can prevail in the process chambers. It is as a rule called vacuum technology if operating states are achieved at pressures of less than or equal to 0.001 mbar (millibar) or 0.1 Pa. Vacuum valves are valves which are designed for said pressure ranges and/or corresponding pressure differences to the surrounding area. Vacuum valves can also be spoken of generally, however, when they are designed for pressures below the normal pressure, that is to say below 1 bar.

It is provided in the case of preferred variants of valves according to the invention that the elastically deformable boundary wall and/or the first connecting section and/or the second connecting section consist/consists of at least one metal or at least one metal alloy. Preferred metals or metal alloys are steels, in particular stainless steels, but also aluminum or aluminum alloys. Fundamentally, however, other materials can of course also be used, in particular ceramics or else carbides or sintered metals. These components can also consist only in part of metal, metal alloys, ceramic or carbide, or can have very different suitable materials.

One of the connecting sections is preferably pushed into the other one of the connecting sections before the clamping connection is established by way of corresponding elastic deformations of the boundary wall. To this end, preferred variants provide that one of the connecting sections has a receiving cavity, and the other one of the connecting sections is arranged in the receiving cavity in that state of the connecting sections, in which they are connected in a clamping manner. It is preferably provided that the closure member or the closure member carrier which is fixed on the closure member has the receiving cavity which is surrounded by the second connecting section. Here, the closure member carrier can be fastened rigidly and fixedly to the closure member. It can also be provided, however, that the valve rod or the additional part which is fixed on the valve rod has the receiving cavity which is surrounded by the first connecting section. The boundary wall which can be deformed elastically by way of a corresponding pressure build-up in the pressure chamber is part of one of the connecting sections and, in preferred variants, is oriented on said part in such a way that it forms at least part of the outer wall of said connecting section which points toward the other connecting section in order to establish the state, in which they are connected in a clamping manner. This applies, in particular, to the variants with a receiving cavity, but can also preferably be realized in this way in the case of other variants.

As an additional measure for particle avoidance, it can be provided that at least one of the connecting sections has a seal, by way of which the receiving cavity is sealed toward the outside when the connecting sections are situated in the state, in which they are connected in a clamping manner.

In order for it to be possible for the pressure chamber to be filled with fluid and possibly also to be correspondingly pressurized, preferred variants of valves according to the invention provide that the valve has a shut-off element for locking in the fluid in the pressure chamber. This is favorably a releasable shut-off element (that is to say, a shut-off element which can be released without destruction by hand or by a tool) which serves to shut the fluid in the pressure chamber, but also for it to be possible for said fluid to be discharged again from said pressure chamber. The shut-off element is particularly preferably configured as an actuating element for setting the pressure of the fluid in the pressure chamber. The shut-off element can, for example, be a screw or can have a screw of this type. In the case of a screw, this is preferably a screw without a projecting head, that is to say what is known as a headless screw. It is particularly preferably provided that the shut-off element has an elastic pressure limiter element. Fundamentally, a very wide variety of pressure fluctuations can be compensated for and/or positive pressures can be equalized or compensated for by way of the pressure limiter element. This is possible as long as the pressure limiter element is situated in its elastic range. For example, the pressure limiter element can ensure that as far as possible no excessive pressure can be set in the pressure chamber by way of the shut-off element, even in the case of incorrect operation. Pressure fluctuations which are induced by temperature or in some other way can also be compensated for by way of the pressure limiter element, however. The pressure limiter element can be, for example, spring elements such as cup springs, helical springs or the like, or else other elastic bodies. The shut-off element can be arranged directly in the closure member. Other variants can also provide, however, that the shut-off element is arranged in a closure member carrier which connects the closure member to the valve rod, as has already been mentioned previously. The shut-off element can likewise of course also be arranged in the valve rod, however. The shut-off element can be situated in the component, in which the pressure chamber is also situated. Within the context of particle avoidance which is as comprehensive as possible, however, it can also be provided that the shut-off element is not arranged directly in the valve rod and is also not arranged directly in the closure member, but rather at a location which is spaced apart therefrom. It is favorably provided in the case of embodiments of this type, in particular, that the shut-off element is arranged in a fluid line which is routed out of the valve rod or out of the closure member.

A method for fastening the closure member to the valve rod of a valve according to the invention preferably provides that the first connecting section and the second connecting section are connected to one another in a clamping manner, by the boundary wall being deformed elastically by way of an increase in a pressure of the fluid in the pressure chamber. A method for releasing a fastening of the closure member to the valve rod of a valve according to the invention preferably provides that a clamping connection of the first connecting section to the second connecting section is released by a pressure of the fluid in the pressure chamber being decreased. It is noted for clarification reasons that both the closure member and the valve rod are parts of the valve according to the invention here. It is also noted for the sake of completeness that, in the case of the method for fastening the closure member to the valve rod, the first connecting section and the second connecting section are of course first of all brought into a position relative to one another which is such that they can be connected to one another correspondingly in a clamping manner. In the case of the method for releasing the fastening of the closure member to the valve rod, the connecting sections and therefore the closure member and the valve rod can be separated from one another and/or removed after the corresponding release of the clamping connection.

BRIEF DESCRIPTION OF THE DRAWINGS

The appended figures which are described in the following text show design variants of the invention which are selected by way of example, the valves being configured in a greatly diagrammatic manner in the regions which are not essential to the invention and in which they can be configured in accordance with a very wide variety of possibilities, as are known from the prior art. This applies, in particular, to the question of how many valve drives there are, how they are configured and where they are arranged. In the figures.

DETAILED DESCRIPTION

Figure 1:
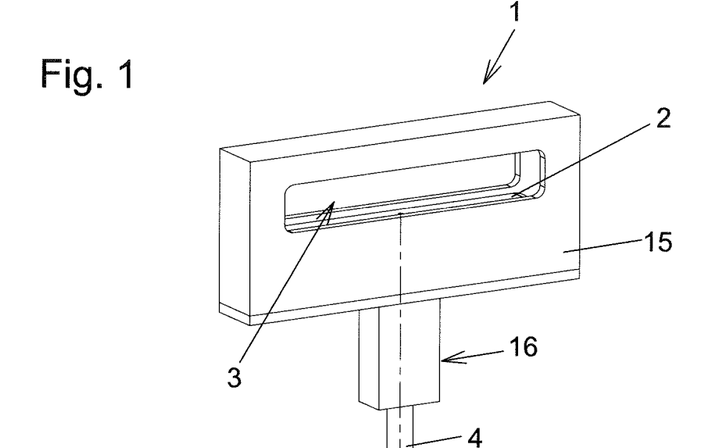
FIG. 1 shows an outer view of a valve or vacuum valve, as is possible for all the exemplary embodiments which are depicted in the following text.

FIG. 1 shows a perspective outer view of a valve 1 which can be configured, in particular, as a vacuum valve. Valves 1 according to the invention can have this appearance, but can also have other external appearances. That variant of the valve 1 which is shown in FIG. 1 has at any rate a valve housing 15, in which two valve openings 3 are arranged, it being possible for one of the two valve openings 3 to be closed by the closure member 2 in the exemplary embodiments which are shown in the following. The valve drive or drives 16 which is/are necessary for moving the closure member 2 between the closed position and the maximum open position is/are not shown in detail in the variants which are shown here. This is also not the subject of the invention and can be configured in a very wide variety of types and ways which are known per se in the prior art. FIG. 1 shows the valve opening 3 in the open state, in which the closure member 2 releases the valve opening 3. In the case of the variants which are shown here, in said position, the valve rod 4 projects a little out of the valve drive 16 which is shown merely in a greatly diagrammatic manner.

All of the design variants shown here of valves 1 according to the invention are what are known as L-port valves, in the case of which the closure member 2 is moved together with the valve rod 4 by the respective valve drive 16, starting from a maximum opening position along a first movement path into an intermediate position. Although the closure member 2 does not yet close the valve opening 3 in said intermediate position, it is already arranged in congruence with the valve opening 3. The closure member 2 is moved into the closed position starting from the intermediate position only by way of the movement of the closure member along a second movement path which is angled away with respect to the first movement path, in which closed position the closure member 2 is pressed, as a rule with a seal 18 positioned in between, against the valve seat which surrounds the valve opening 3, and thus seals the valve opening 3. These matters are known per se in the prior art and do not have to be described in detail. It is to be noted above all, however, that valves 1 according to the invention do not of course absolutely have to be configured as an L-port valve. Connections according to the invention of the closure member 2 and the valve rod 4 can also be used in other valve types which are known per se.

FIGS. 2 to 6 then show a first exemplary embodiment of a valve 1 according to the invention. Longitudinal sections through the valve 1 in the region of the parts which are essential to the invention are shown in each case, that is to say, in particular, of the connection between the closure member 2 and the valve rod 4. As has already been stated, the valve drive 16 is not shown in detail. Merely that point is identified, at which the valve drive 16 or at least one of the valve drives 16 is arranged as a rule. Reference can be made here to the prior art.

Figure 2:
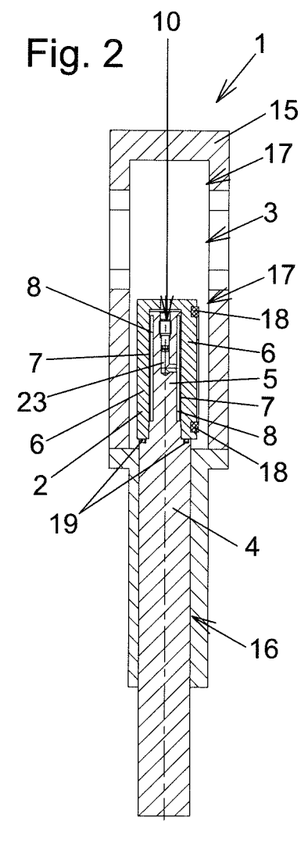
FIGS. 2 to 6 show illustrations with respect to a first exemplary embodiment according to the invention of a valve.
Figure 3:
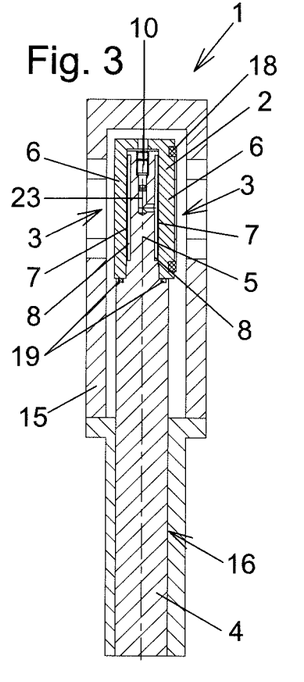
Figure 4:
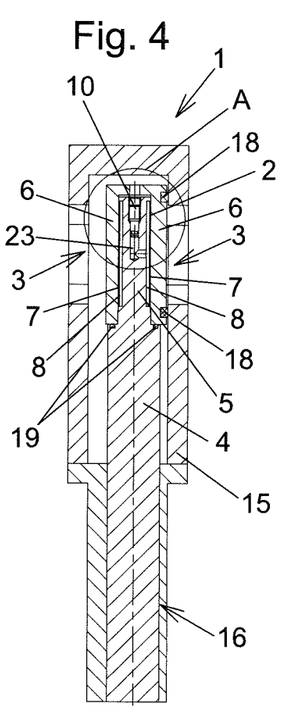

FIG. 2 shows the closure member 2 of said exemplary embodiment of the valve 1 according to the invention in the maximum open position, in which the valve opening 3 is released completely. FIG. 3 shows the intermediate position, in which the closure member 2 has already been moved into congruence with the valve opening 3, but does not yet close the latter. FIG. 4 shows the closed position, in which the closure member 2 seals the valve opening 3. To this end, the closure member 2 is pressed by the valve drive 16 with its seal 18 against the valve seat 17 which surrounds the valve opening 3. In the exemplary embodiment which is shown, the valve opening 3 and the valve seat 17 are arranged in the valve housing 15 which is part of the valve 1. This does not necessarily have to be the case, however, as has already been explained at the outset.

Figure 5:
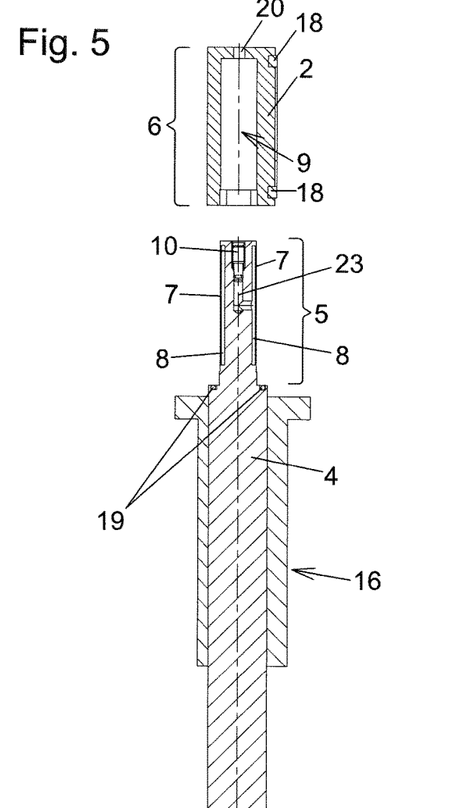

FIG. 5 shows the valve 1 of the first exemplary embodiment without a valve housing 15. Above all, however, the closure member 2 is removed from the valve rod 4 in FIG. 5. Therefore, in said position according to FIG. 5, the first connecting section 5 of the valve rod 4 is no longer connected to the second connecting section 6 of the closure member 2. In said position, in which it is released from the valve rod 4, the closure member 2 can be serviced, that is to say can be subjected to a service or can be replaced.

It can be seen particularly clearly in FIG. 5 that the closure member 2 which is configured as a valve disk in said exemplary embodiment, as is also the case in the other exemplary embodiments, has a receiving cavity 9 which is surrounded by the second connecting section 6 of the closure member 2 in the exemplary embodiment which is shown. In order to connect the closure member 2 to the valve rod 4, the first connecting section 5 of the valve rod 4 is pushed into said receiving cavity 9. The clamping connection of the first connecting section 5 to the second connecting section 6 and therefore the clamping fastening of the closure member 2 to the valve rod 4 then takes place by way of a corresponding application of an increased pressure in a fluid in the pressure chamber 8, as a result of which the boundary wall 7 which delimits the pressure chamber 8 is pressed against the other connecting section in such a way that a clamping connection occurs.

Figure 6:
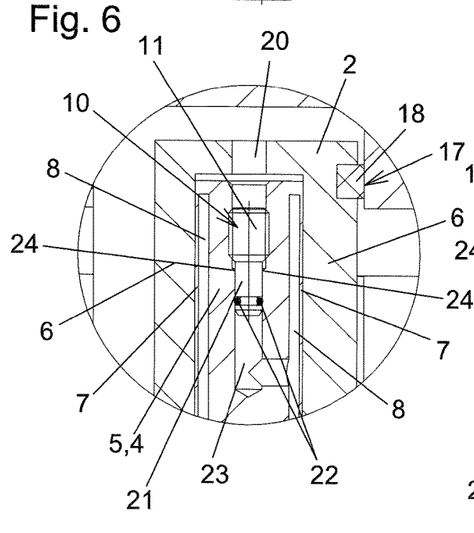

FIG. 6 shows the enlarged region A from FIG. 4.

As can be seen particularly clearly in FIGS. 5 and 6, the pressure chamber 8 and also its elastically deformable boundary wall 7 are part of the first connecting section 5 and therefore of the valve rod 4 in said first exemplary embodiment. In said first exemplary embodiment, as is also the case in most of the other exemplary embodiments which are depicted in the following text, the pressure chamber 8 is configured as a cavity which is configured in the shape of a tubular shell and is delimited toward the outside by the elastically deformable boundary wall 7. In said embodiment, as is the case also in other preferred embodiments, the elastically deformable boundary wall 7 is configured thus at least as one part of that one of the connecting sections 5 and 6 which is arranged so as to lie opposite the other one of the connecting sections 5 and 6 in the connecting position. In order for it to be possible to shut in the fluid in the pressure chamber 8 but also to pressurize it, a shut-off element 10 is realized in said first exemplary embodiment, which shut-off element 10 is shown on an enlarged scale in FIG. 6 and is arranged in an internal line section 23 which is connected to the pressure chamber 8. The shut-off element 10 of said first exemplary embodiment is therefore configured as an actuating element and has a headless screw 11 which can be screwed into a thread (not shown in detail here) in the internal line section 23. As is also realized here, the adjustment travel of the shut-off element 10 can be limited by way of a stop 24. As in this example here, the stop 24 can also ensure limiting of the maximum pressure which can be set. A piston 21 is supported or formed integrally on the headless screw 11 of said first exemplary embodiment of a shut-off element 10, which piston 21 is mounted such that it can be displaced in the longitudinal direction of the internal line section 23. The piston 21 is sealed via the piston seal 22 against the internal line section 23. The headless screw 11 and the piston 21 can be configured in one piece as one component or else as separate components.

In the first exemplary embodiment, the shut-off element 10 and the internal line section 23 are arranged in the valve rod 4 or in the first connecting section 5. Via a through-passage opening 20 in the closure member 2, a tool which is not shown here, such as for example an Allen key, a screwdriver or the like, can engage into the headless screw 11 of the shut-off element 10, in order to actuate said headless screw 11. By way of corresponding screwing in the one direction, the pressure of the fluid in the internal line section 23 and in the pressure chamber 8 can be increased, with the result that the elastically deformable boundary wall 7 is deflected to the outside in order to establish a clamping connection between the two connecting sections 5 and 6. In order to release the clamping connection, the headless screw 11 is screwed in the opposite direction, whereby the pressure in the fluid in the internal line section 23 and in the pressure chamber 8 can be decreased to such an extent that the boundary wall 7 returns elastically into its starting position again, and the clamping connection between the first and second connecting section 5 and 6 is released. Subsequently, the closure member 2 can be removed from the valve rod 4, as shown in FIG. 5.

Fundamentally, all fluids which are suitable for a corresponding pressure build-up can be used as fluids. To this end, above all, the customary liquids which are known per se, in particular hydraulic liquids, can be used. The fluid can also be a gas, a gel or mixtures of said fluids, however.

Within the context of optimum avoidance of particle formation during the connection and disconnection of the two connecting sections 5 and 6, a seal 19 is provided in said first exemplary embodiment, as is also the case in the other exemplary embodiments, which seal 19 seals the receiving cavity 9 toward the outside when the connecting sections 5 and 6 are connected to one another, that is to say the first connecting section 5 of the valve rod 4 is introduced completely into the receiving cavity 9 of the second connecting section 6, that is to say of the closure member 2.

In the following text, further exemplary embodiments according to the invention of valves 1 will now be described by way of example, which exemplary embodiments ultimately represent modified forms of said first exemplary embodiment according to FIGS. 2 to 6. Therefore, only the changes with respect to the first exemplary embodiment or another exemplary embodiment which is described in the following text will be described. Only the closing position will also be shown. With regard to all other designs and positions, reference is made to the first exemplary embodiment.

Figure 7:
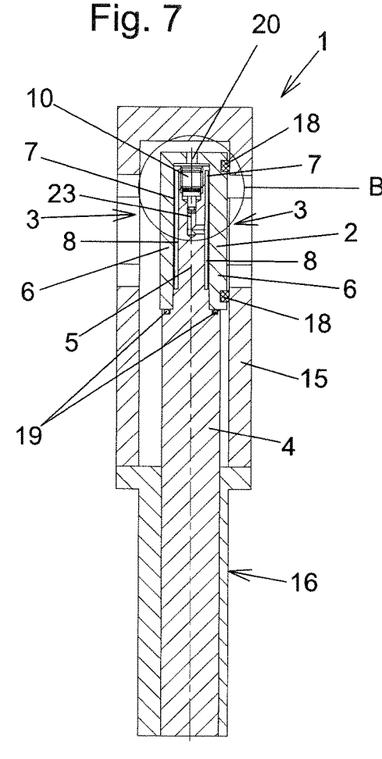
FIGS. 7 and 8 show illustrations with respect to a second exemplary embodiment according to the invention of a valve according to the invention.
Figure 8:
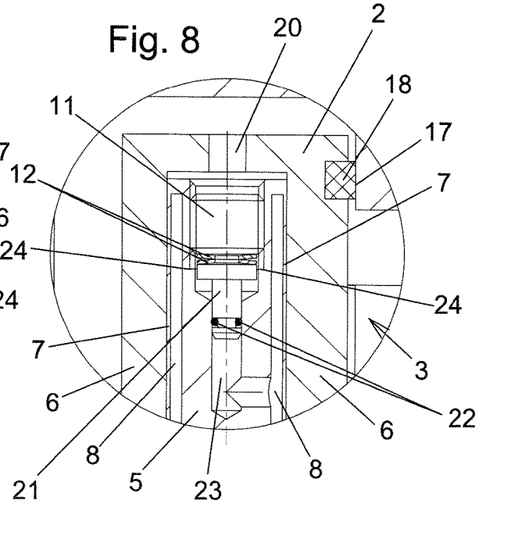

In the second exemplary embodiment according to FIGS. 7 and 8, another shut-off element 10 is shown by way of example. Here, FIG. 8 shows the region B from FIG. 7 on an enlarged scale. In said second exemplary embodiment of a shut-off element 10, there is an elastic pressure limiter element 12 which is configured as a sequence of two cup springs between the headless screw 11 and the piston 21. Instead of cup springs, this might of course also be configured as one or more helical springs or as another elastic body, in order merely to indicate further designs. The pressure limiter element 12 serves at any rate to set the upper limit of the pressure which is generated in the fluid in the pressure chamber 8. The corresponding selection of the pressure limiter element 12 and/or its elastic properties can ensure that, after a certain pressure threshold value is exceeded, further tightening of the headless screw 11 leads to a corresponding elastic deformation of the pressure limiter element 12 and therefore no longer leads to a further increase in the pressure in the fluid in the pressure chamber 8. Moreover, the pressure limiter element 12 can also compensate for pressure fluctuations which are induced thermally or in some other way, however. The actuation of the headless screw 11 of said shut-off element 10, and therefore the actuation of the shut-off element 10, otherwise takes place as in the first exemplary embodiment.

With respect to the designs of the invention which are described in the following text, it is noted that, even if this is no longer shown in detail, both the shut-off element 10 of the first exemplary embodiment and the shut-off element 10 of the second exemplary embodiment and other shut-off elements 10 can be used, in so far as they are required at all.

Figure 9:
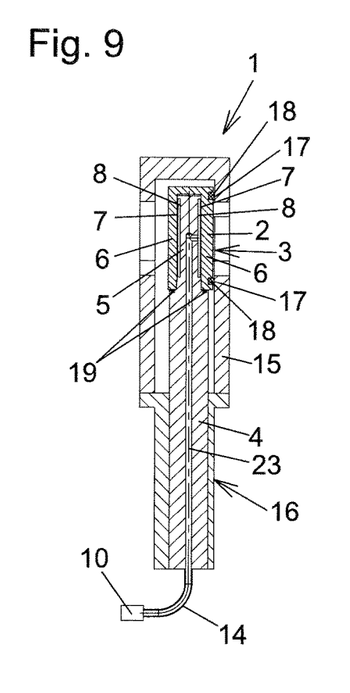
FIGS. 9, 10 and 11 show corresponding illustrations with respect to a third, fourth and fifth exemplary embodiment of the invention.
Figure 10:
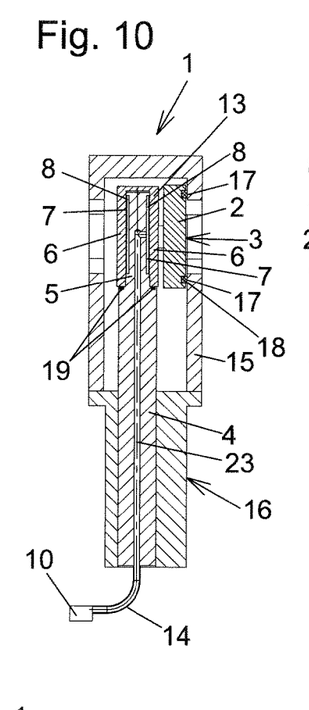

The variant which is shown in FIG. 9 is a modification of the first exemplary embodiment, in the case of which modification the shut-off element 10 is no longer arranged directly in the valve rod 4 or in the first connecting section 5, but rather in a fluid line 10 which is routed out of the valve rod 4. This has the advantage that the shut-off element 10 can also be arranged outside the valve housing 15, with the result that a production of particles within the valve housing 15 is avoided even more completely in the case of said variant. FIG. 10 is in turn a modification of the design variant according to FIG. 9. Here, the second connecting section 6 is not arranged directly in the closure member 2, but rather in a closure member carrier 13 and therefore only on the closure member 2. Here, the closure member carrier 13 is preferably fastened rigidly and fixedly to the closure member 2.

Figure 11:
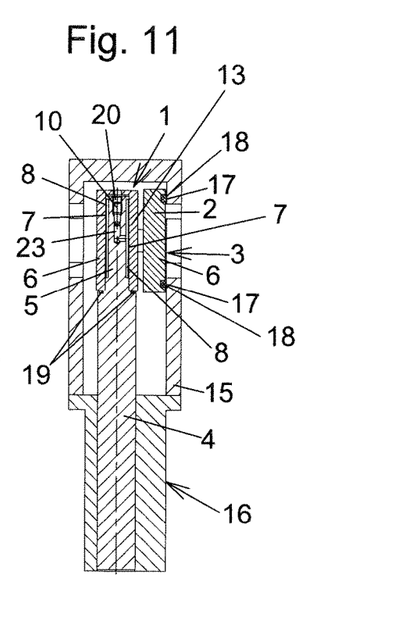

FIG. 11 in turn shows one exemplary embodiment, in the case of which, starting from the variant according to FIG. 10, the fluid line 14 which is routed out has in turn been dispensed with, and the shut-off element 10 has been arranged again (as in the first exemplary embodiment) directly in the valve rod 4 and therefore in the first connecting section 5.

Whereas the pressure chamber 8 and also the elastically deformable boundary wall 7 were always configured in the first connecting section 5 and therefore in the valve rod 4 in the case of the exemplary embodiments which have been depicted up to now, the design variants which are depicted in the following text then show by way of example that this does not necessarily have to be the case. In all of the design variants which are depicted in the following text, the pressure chamber 8 and the boundary wall 7 are configured in or on the closure member 2.

Figures 12, 13:
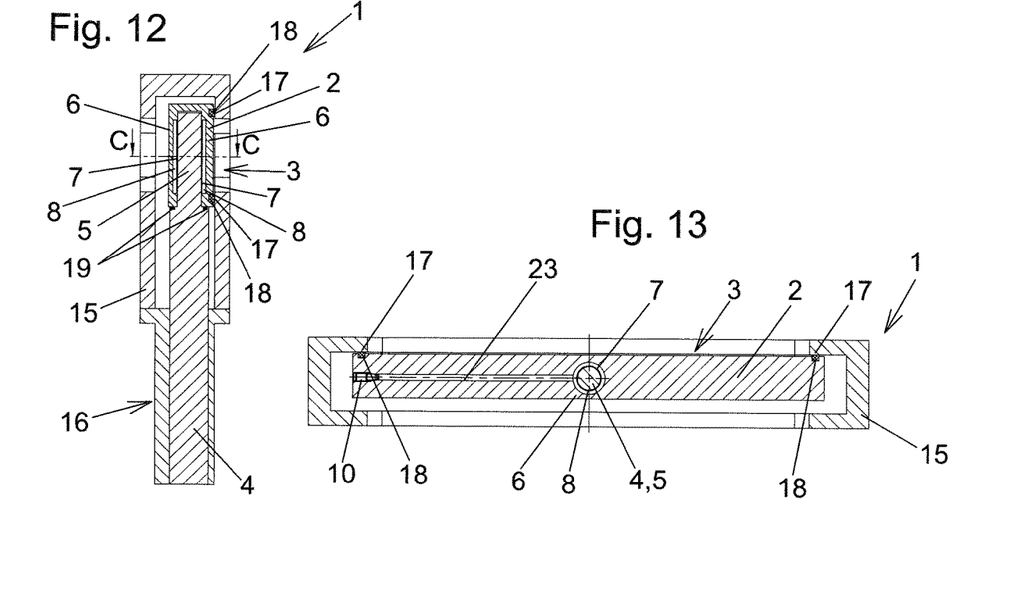
FIGS. 12 to 14 show illustrations with respect to a sixth exemplary embodiment of the invention.
Figure 14:
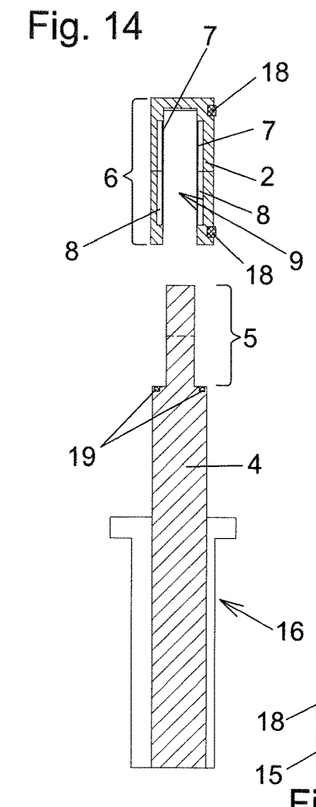

In the design variant, as shown in FIGS. 12 to 14, the pressure chamber 8 and the boundary wall 7 are directly part of the closure member 2. The second connecting section 6 is therefore configured directly in the closure member 2. FIG. 13 shows the horizontal section along the sectional line CC from FIG. 12. In FIG. 14, the valve housing 15 is removed, and the closure member 2 is detached from the valve rod 4. In this variant of the invention, the elastically deformable boundary wall 7 is configured as an inner wall which delimits the receiving cavity 9 or as an inner wall region of this type of the second connecting section 6. The pressure chamber 8 surrounds the boundary wall 7 and is therefore also arranged in the second connecting section 6. In this exemplary embodiment, the cavity of the pressure chamber 8 also has the form of a tubular shell wall.

It can be seen clearly in the section CC according to FIG. 13 that, in this design variant, the shut-off element 10 is arranged on a lateral edge of the closure member 2 and is therefore accessible from the outside in the closure member 2. As is also the case in the other exemplary embodiments, the internal line section 23 leads to the pressure chamber 8. In said design variant, the boundary wall 7 is deflected elastically to the inside by way of a corresponding pressure increase in the fluid in the pressure chamber 8, in order thus to achieve the clamping connection between the first connecting section 5 and the second connecting section 6 and therefore between the valve rod 4 and the closure member 2.

Figure 15:
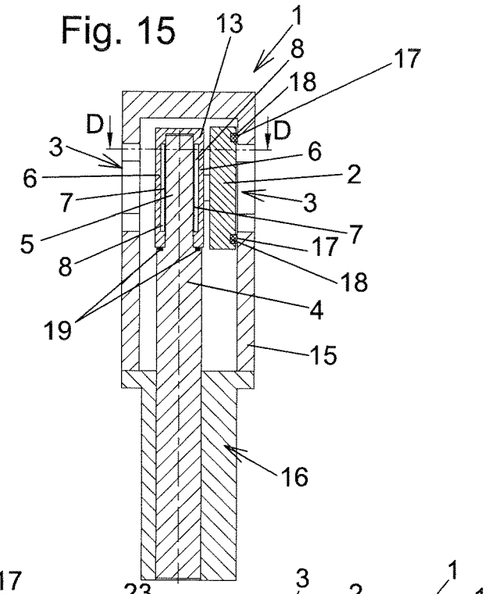
FIGS. 15 and 16 show depictions with respect to a seventh exemplary embodiment of the invention.
Figure 16:
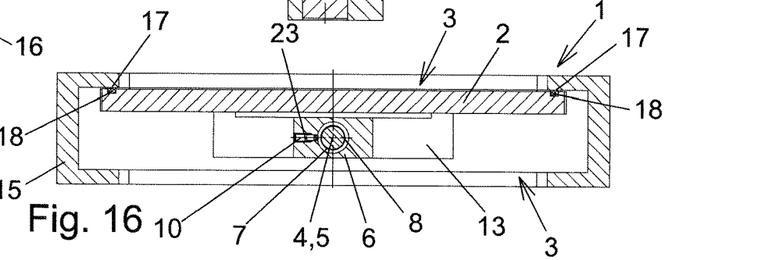

The design variant according to FIGS. 15 and 16 shows one modification of the variant according to FIGS. 12 to 14. FIG. 16 shows the section along the sectional line DD from FIG. 15. The essential difference of the exemplary embodiment according to FIGS. 15 and 16 from the exemplary embodiment according to FIGS. 12 to 14 consists in that the second connecting section 6 is not arranged in the closure member 2 here, but rather on the closure member 2. Here, the second connecting section 6 and therefore also the pressure chamber 8 and the boundary wall 7 are part of a closure member carrier 13 which is fastened to the closure member 2 (preferably fixedly and permanently) and connects the closure member 2 to the valve rod 4. Here, the shut-off element 10 and the internal line section 23 are correspondingly situated in the closure member carrier 13.

Figure 17:
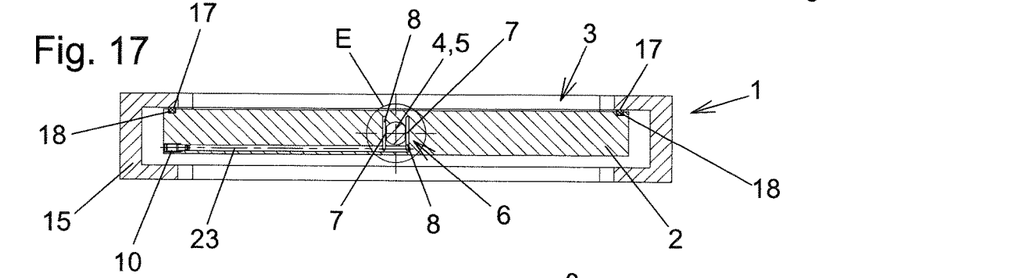
FIGS. 17 and 18 show illustrations with respect to an eighth exemplary embodiment of the invention.
Figure 18:
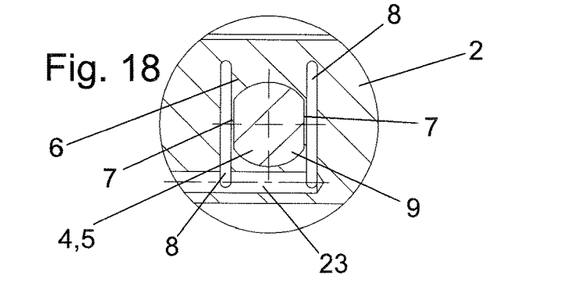

FIGS. 17 and 18 show a design variant, in the case of which two pressure chambers 8 and two boundary walls 7 are provided and are arranged in the second connecting section 6 and directly in the closure member 2 here. This exemplary embodiment shows that the pressure chamber 8 and also the boundary walls 7 can of course be of very different form and do not always have to be of tubular configuration, as in the previously shown design variants. FIG. 18 shows the region E from FIG. 17 on an enlarged scale. It can be seen clearly here that the receiving cavity 9 of the closure member 2, in which receiving cavity 9 the first connecting section 5 of the valve rod 4 is arranged, can also have a non-round form in cross section. This can be used, for example, for the closure member 2 to at the same time automatically be aligned correctly during the arrangement on the valve rod 4. To this end, a very wide variety of cross-sectional forms which differ from the circular form can of course be realized. It can be seen clearly in FIG. 18 how the two boundary walls 7 are arranged on opposite flattened sides of the first connecting section 5 of the valve rod 4. By way of a corresponding pressure increase in the pressure chamber 8, an elastic deflection or deformation of the boundary walls 7 can in turn be achieved, and therefore a clamping connection of the two connecting sections 5 and

LIST OF DESIGNATIONS

1 Valve
2 Closure member
3 Valve opening
4 Valve rod
5 First connecting section
6 Second connecting section
7 Boundary wall
8 Pressure chamber
9 Receiving cavity
10 Shut-off element
11 Headless screw
12 Pressure limiter element
13 Closure member carrier
14 Fluid line
15 Valve housing
16 Valve drive
17 Valve seat
18 Seal
19 Seal
20 Through-passage opening
21 Piston
22 Piston seal
23 Inner line section
24 Stop

The invention claimed is:

1. A valve, comprising:
at least one closure member for closing a valve opening,
at least one valve rod,
at least one first connecting section arranged in or on the valve rod,
at least one second connecting section arranged in or on the closure member,
the closure member being fastenable or fastened to the valve rod by connection of the first connecting section to the second connecting section,
at least one of the first connecting section or the second connecting section has at least one pressure chamber for a fluid, said pressure chamber is delimited by at least one elastically deformable boundary wall,
the boundary wall is elastically deformable by the fluid arranged in the pressure chamber to form a clamping connection of the first connecting section to the second connecting section,
a shut-off element configured for locking the fluid in the pressure chamber, and
the shut-off element comprises an elastic pressure limiter element.

2. The valve as claimed in claim 1, wherein at least one of the boundary wall, the first connecting section, or the second connecting section are formed of at least one metal or at least one metal alloy.

3. The valve as claimed in claim 1, wherein one of the first or second connecting sections has a receiving cavity, and the other one of the first or second connecting sections is arranged in the receiving cavity in a state of the connecting sections in which they are connected in a clamping manner.

4. The valve as claimed in claim 1, wherein the shut-off element is configured as an actuating element for setting a pressure of the fluid in the pressure chamber.

5. The valve as claimed in claim 1, wherein the shut-off element comprises a screw.

6. The valve as claimed in claim 1, wherein the shut-off element is arranged in the closure member, in a closure member carrier which connects the closure member to the valve rod, in the valve rod, or in a fluid line which is routed out of the valve rod or out of the closure member.

7. A method for fastening the closure member to the valve rod of the valve as claimed in claim 1, the method comprising assembling the first connecting section and the second connecting section with one another, and connecting the first connecting section and second connecting section by elastically deforming the boundary wall by increasing a pressure of the fluid in the pressure chamber.

8. A method for releasing a fastening of the closure member to the valve rod of the valve as claimed in claim 1, the method comprising releasing the clamping connection of the first connecting section to the second connecting section by decreasing a pressure of the fluid in the pressure chamber.

9. The valve as claimed in claim 1, wherein the shut-off element is configured for releasably locking in the fluid in the pressure chamber.

10. The valve as claimed in claim 1, wherein the shut-off element comprises a headless screw.

* * * * *